United States Patent [19]
Yang et al.

[11] Patent Number: 5,350,700
[45] Date of Patent: Sep. 27, 1994

[54] METHOD OF FABRICATING BIPOLAR TRANSISTORS WITH BURIED COLLECTOR REGION

[75] Inventors: Ming-Tzong Yang, Hsin, Chu; Chung-Cheng Wu, I-Lan, both of Taiwan

[73] Assignee: United Micro Electronics Corporation, Hsin Chu, Taiwan

[21] Appl. No.: 160,243

[22] Filed: Dec. 2, 1993

[51] Int. Cl.$^5$ .................................... H01L 21/265
[52] U.S. Cl. .................................... 437/31; 437/35; 437/64
[58] Field of Search .............. 437/31, 32, 33, 35, 437/64; 257/586

[56] References Cited

U.S. PATENT DOCUMENTS

| | | | |
|---|---|---|---|
| 4,160,986 | 7/1979 | Johnson | 257/586 |
| 4,897,703 | 1/1990 | Spratt et al. | 257/586 |
| 5,047,823 | 9/1991 | Treitinger et al. | 437/33 |
| 5,100,810 | 3/1992 | Yoshimi et al. | 437/59 |
| 5,183,768 | 2/1993 | Kameyama et al. | 437/26 |
| 5,219,767 | 6/1993 | Kohno | 437/31 |
| 5,266,504 | 11/1993 | Blouse et al. | 437/31 |
| 5,270,226 | 12/1993 | Hori et al. | 437/41 |

*Primary Examiner*—Olik Chaudhuri
*Assistant Examiner*—Brian K. Dutton
*Attorney, Agent, or Firm*—George O. Saile; Wolmar J. Stoffel

[57] ABSTRACT

A method of fabricating a bipolar transistor with a buried subcollector by forming a collector layer and a base layer in a semiconductor substrate. A polysilicon layer is deposited over the base layer and spaced emitter and base contact regions formed in the base layer. A mask is formed over the emitter and base contact regions and the substrate anisotropically etched to form pedestals with vertical sidewalls. A masking layer is formed on the vertical sidewalls, and a large angle ion implant used to introduce ions beneath the collector layer, thereby forming a subcollector region.

16 Claims, 5 Drawing Sheets

METHOD OF FABRICATING BIPOLAR TRANSISTORS WITH BURIED COLLECTOR REGION

BACKGROUND OF THE INVENTION (1) Field of the Invention.

This invention relates to bipolar transistors and to improved methods of fabricating such transistors. The method of fabrication eliminates the requirement of depositing an epitaxial layer, while providing a buried subcollector region.

(2) Description of the Prior Art.

High frequency bipolar transistors, as used in microminiaturized integrated circuit devices, utilize a buried subcollector. The conventional process for forming a buried subcollector is to introduce an impurity for semiconductors into a monocrystalline semiconductor substrate to form high impurity concentration regions adjacent to the surface. An epitaxial semiconductor layer is deposited the substrate over the regions. The impurity normally diffuses upward for a small distance into the epitaxial layer. The various active regions of the bipolar device are then formed into the epitaxial layer to complete the transistor.

However, the epitaxial process is time consuming and expensive. Further, the yield of usable product is low.

It is an object of the invention to provide a process for forming a bipolar transistor for integrated circuit devices that does not require the use of an epitaxial layer.

Another object of the invention is to provide a bipolar transistor provided with a subcollector region that is contained entirely in the intrinsic semiconductor material of a monocrystalline semiconductor substrate.

In accordance with the aforementioned objectives, there is provided a process for forming a bipolar transistor wherein a collector layer and a thinner overlying base layer are formed in a semiconductor substrate by introducing impurity ions into the substrate. After depositing a polycrystalline layer on the surface of the substrate, an emitter region and a spaced base contact region are formed in the base layer by ion implantation of the appropriate impurities. A masking implant-stopping layer, for example tungsten, molybdenum or tantalum metal is deposited and shaped to overly the emitter and base contract regions. The substrate is then anisotropically etched to a depth slightly deeper than the emitter and base contact regions. The area between the emitter and base contact regions is masked and the etching continued through the collector layer to complete a pedestal structure. A implant-stopping layer is deposited and anisotropically etched to form implant-stopping layers on the vertical walls of the pedestal. A subcollector is formed beneath the collector layer by implanting impurity ions at an angle to the top surface of the substrate. The masking layer is removed and terminals formed to join the elements of the transistor.

A bipolar pedestal transistor is presented having a subcollector, wherein all of the elements are in the intrinsic monocrystalline semiconductor substrate. A major pedestal contains a lower collector layer and an overlying base layer. Two spaced minor pedestals are supported on the major pedestal. An emitter region is provided in a first minor pedestal in contact with the base layer, and a base contact region is provided in the second minor pedestal, also in contact with the base layer. A subcollector is provided in the substrate beneath the major pedestal in contact with the collector layer.

BRIEF DESCRIPTION OF THE DRAWINGS

FIG. 9 is a sideview of FIG. 8.
FIG. 11 is a sideview of FIG. 10.
FIG. 12 is a top view of FIG. 10.
FIG. 13 is a sideview of the complete device.

DESCRIPTION OF PREFERRED EMBODIMENTS

Figure 1:
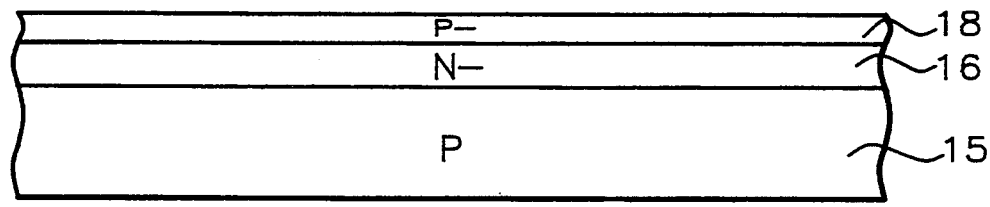
FIG. 1 through 13 depict a sequence of cross sectional views, in broken section and in greatly enlarged scale, that illustrates the subject transistor invention at various stages of fabrication.

Referring now to the figures of the drawing, FIG. 1 through 13 illustrate the process of fabricating a bipolar device on a monocrystalline semiconductor substrate 15. The substrate 15 is preferably formed of monocrystalline silicon, but could alternatively be other group IV semiconductors, such as Geranium (Ge), or compound semiconductors, such as Silicon Geranium (Si Ge), Gallium Arsenide (Ga As), and Indium Phosphide (In P). As shown in FIG. 1, a collector layer 16 is formed in substrate 15 by introducing a suitable impurity for semiconductors into the upper surface of the substrate. Preferably the impurity is introduced by ion implantation techniques. The impurity can be either N or P type depending on the type of transistor desired. The depth of the collector layer is typically in the range of 3000 Angstroms to 10 micrometers. An N type region 16 can be formed by ion implanting $P_{31}$ ions at an acceleration voltage in the range of 50 KeV to 500 KeV at a dosage of between about $5\,E\,11$ and $5\,E\,13\,cm^{-2}$. The collector layer should have an average impurity concentration in the range of $1\,E\,15$ to $1\,E\,17\,cm^{-3}$. The substrate 15 will have a background impurity of a type opposite the type in the collector layer. Subsequently, a base layer 18 is formed in substrate 15 by introducing an impurity of a type opposite the type used to form the collector layer 16. The base layer 18 has a thickness less than the collector layer, typically in the range of 1000 to 6000 Angstroms. Base layer 18 can typically be formed by ion implanting B ions at an acceleration voltage in the range of 10 to 100 KeV at a dosage of between about $5\,E\,12$ and $1\,E\,14\,cm^{-2}$, providing an average impurity concentration in the range of $1\,E\,16$ to $1\,E\,18\,cm^{-3}$.

Figure 2:
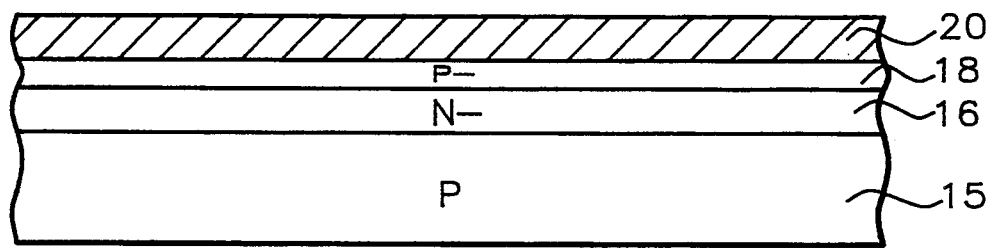

As shown in FIG. 2, a polycrystalline silicon layer 20 is deposited over base layer 18, using conventional techniques. Layer 20 has a thickness in the range of 1000 to 2000 Angstroms and is typically deposited by LPCVD at a temperature in the range of 500° C. and 750° C. and at a pressure between about 0.01 Torr and 10 Torr in Silane ($SiH_4$).

Figure 3:
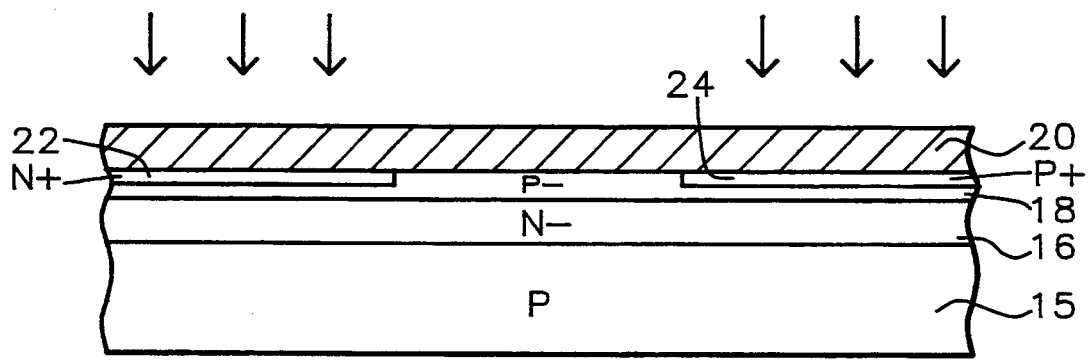

As shown in FIG. 3, an emitter region 22 is formed in base layer 18, by implanting an impurity of the same type as the collector layer through the polycrystalline silicon layer 20. The emitter region is confined to the area shown by suitable masking (not shown) of the substrate. The thickness of the emitter region 22 is typically in the range of 500 to 5000 Angstroms. It can be formed by ion implanting As ions. at an acceleration voltage in the range of 30 to 100 KeV at a dosage of between about $1\,E\,14$ and $1\,E\,16\,cm^{-2}$, thereby providing an average impurity concentration in the range of $1\,E\,18$ to $5\,E\,20\,cm^{-3}$. The layer 20 above the emitter region 22 is given an impurity by the same process. A base contact region 24 is formed in base layer 18, in spaced relation to the emitter region by implanting an impurity of a type similar to the type in base layer 18. The layer 24 is formed by masking the substrate and implanting a suitable impurity ion through layer 20. Region 24 has a thickness comparable to the emitter region 22. It is typically formed by ion implanting Boron ion at an acceleration voltage in the range of 10 to 100 KeV, with a dosage of between about $1 \text{ E } 13$ and $5 \text{ E } 16 \text{ cm}^{-2}$ providing an average impurity concentration in the range of $1 \text{ E } 18$ to $5 \text{ E } 20 \text{ cm}^{-3}$.

Figure 4:
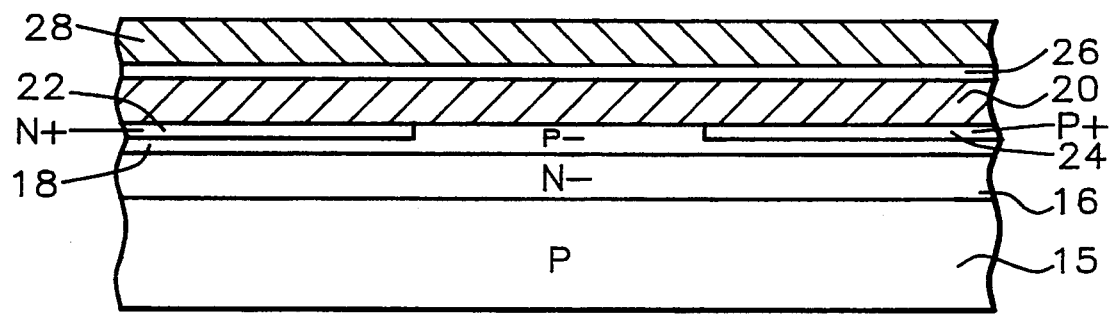

As shown in FIG. 4, a silicon oxide layer 26 is formed over layer 20, preferably by oxidizing layer 20. The thickness of layer 26 is in the range of 100 to 2000 Angstroms. Masking layer 28 is deposited over layer 26. Layer 28 is preferably a refractory metal, such as Tungsten (W), Molybdenum (Mo), Tantalum (Ta), and mixtures thereof. Layer 28 has a thickness in the range of 500 to 1000 Angstroms and can be deposited by chemical vapor deposition (CVD), evaporation or sputter deposition techniques.

Figure 5:
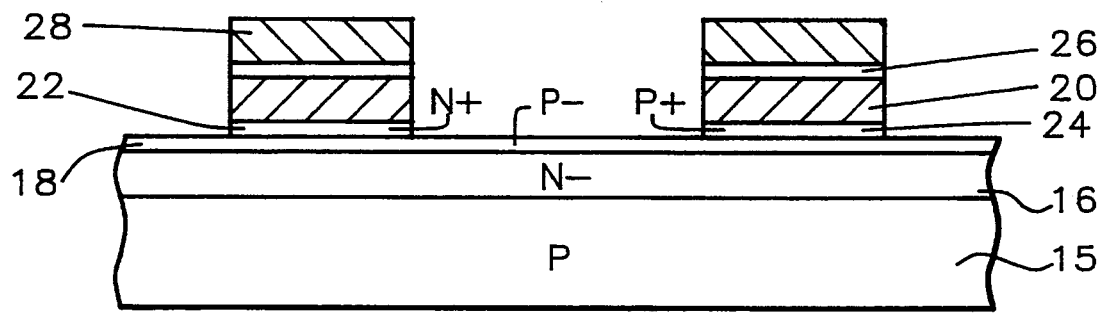

As shown in FIG. 5, the implant-stopping layer 28, such as tungsten is masked over the emitter 22 and base contact 24 regions, and etched to form a mask. The layers 28, 26, and a portion of base layer 18, to a depth below regions 22 and 24, are anisotropically etched. This provides vertical sidewalls and results in two spaced minor pedestals. Where tungsten is used, the anisotropic etching is well known and consists basically of $CF_4$, $SF_6$, HBr, $Cl_2$, $CF_xCl_y$, $C_2F_6$, $CHF_xCl_y$ at a pressure in the range of 50 to 1000 mTorr and a power of between about 100 to 2000 Watts.

Figure 6:
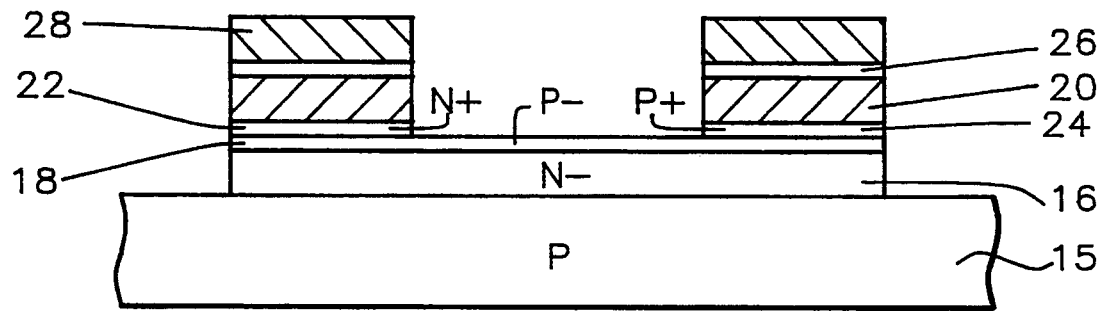
Figure 7:
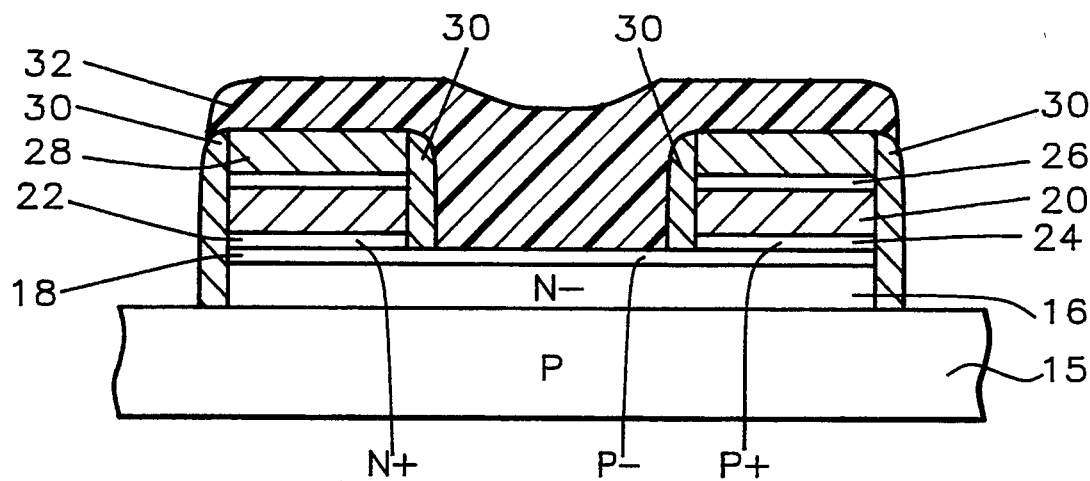

As shown in FIG. 6, the area between regions 22 and 24 is masked (not shown) and the anisotropic etching continued through layers 18 and 16. This newly formed base for the minor pedestals can be considered a major pedestal. As depicted in FIG. 7, masking layers 30 are formed on the vertical walls of the minor and major pedestals. The layer 30 is formed of implant-stopping material, preferably tungsten. The layer 30 is formed by depositing a conformal metal layer over the surface of the substrate, and anisotropically etching the layer. The conformal layer is preferably deposited by CVD techniques and the etching done by anisotropic etching. The anisotropic etching is well known and consists basically of $CF_4$, $SF_6$, $C_2F_6$, HBr, $CL_2$, $CF_xCl_y$, $CHF_xCL_y$ at a pressure in the range of 50 to 1000 mTorr and a power of between about 100 and 2000 Watts.

This results in the layer 30 on the vertical sidewalls of the pedestal. Subsequently, a photoresist masking layer 32 is formed to protect the area of base layer 18 between the emitter and base contact regions.

Figure 8:
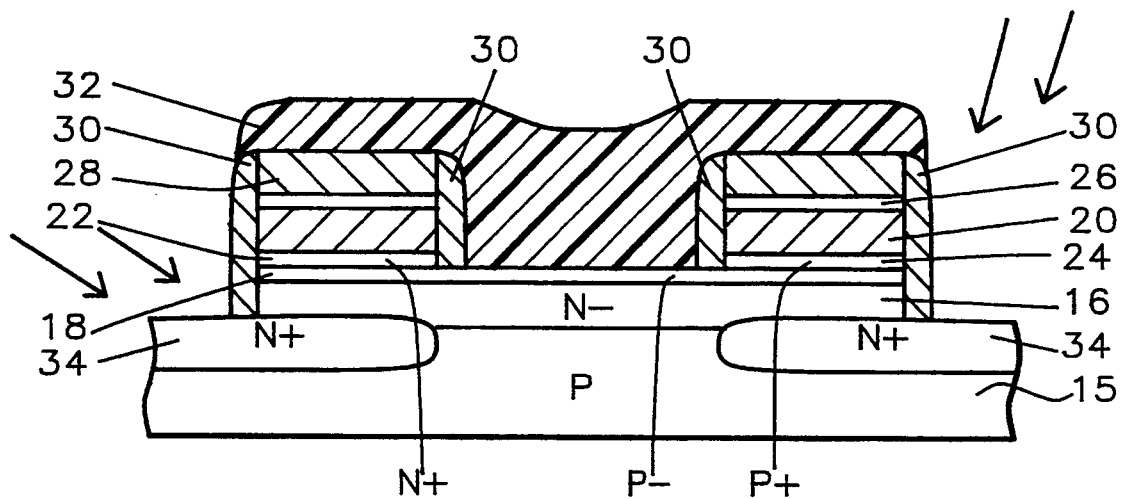
Figure 9:
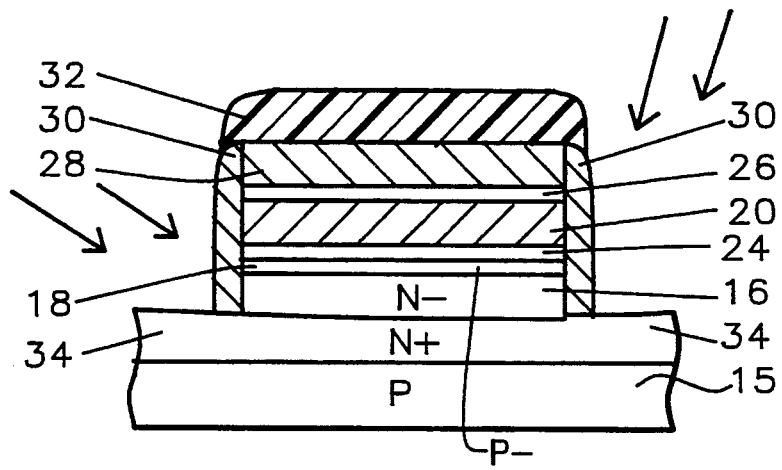

As shown in FIGS. 8 and 9, the buried subcollector region 34 is formed in substrate 15, beneath collector layer 16, by ion implanting suitable impurity ions at an angle that is inclined from a perpendicular axis relative to the top surface of the substrate. The implantation is made from all angles by rotating the substrate as the ions are accelerated into the substrate. The same result can be achieved by wobbling the substrate relative to the path of the ions. This results in a subcollector region that substantially underlies the collector region 16, which is achieved without the use of a conventional epitaxial layer in the process and the device structure. Typically the ion implantation step is done by accelerating a P and As ion at an acceleration voltage in the range of 50 to 500 KeV with a dosage of between about $5 \text{ E } 13$ and $5 \text{ E } 16 \text{ cm}^{-2}$. The ions are directed at the substrate at an angle in the range of 3° to 85° C., relative to a perpendicular axis to the top surface of the substrate. The device is rotated during the implantation at a rate of between about 0.1 and 10 rev/sec. This results in a subcollector region with an average impurity concentration in the range of $1 \text{ E } 18$ to $1 \text{ E } 21 \text{ cm}^{-3}$. The implantation damage to the substrate crystalline structure must be eliminated by a suitable anneal after the subcollector implantation after the subcollector implantation.

Figure 10:
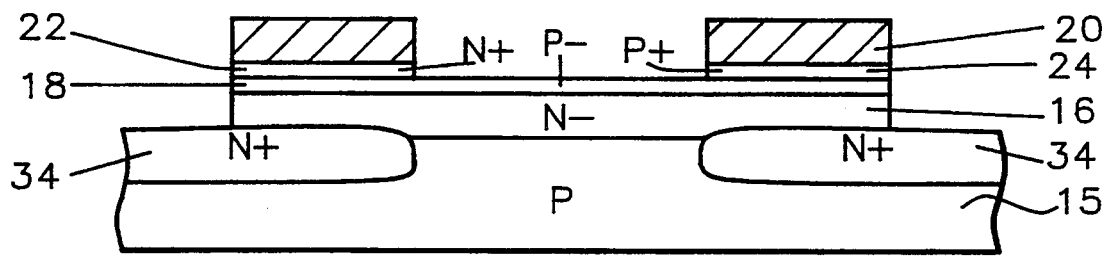
Figure 11:
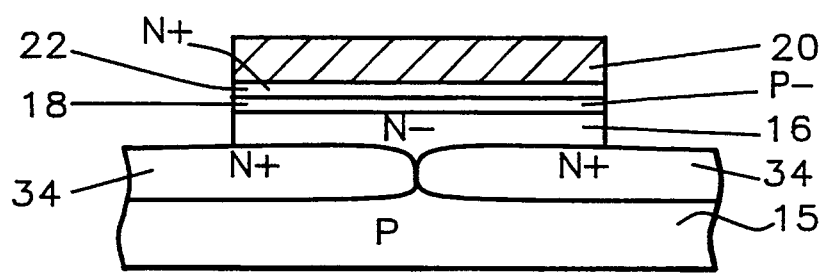
Figure 12:
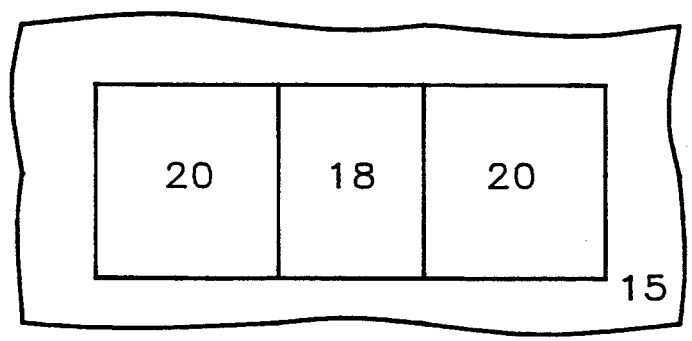

As shown in FIGS. 10, 11, and 12, the mask layers 30 and 32 are removed resulting in the bipolar transistor illustrated.

Figure 13:
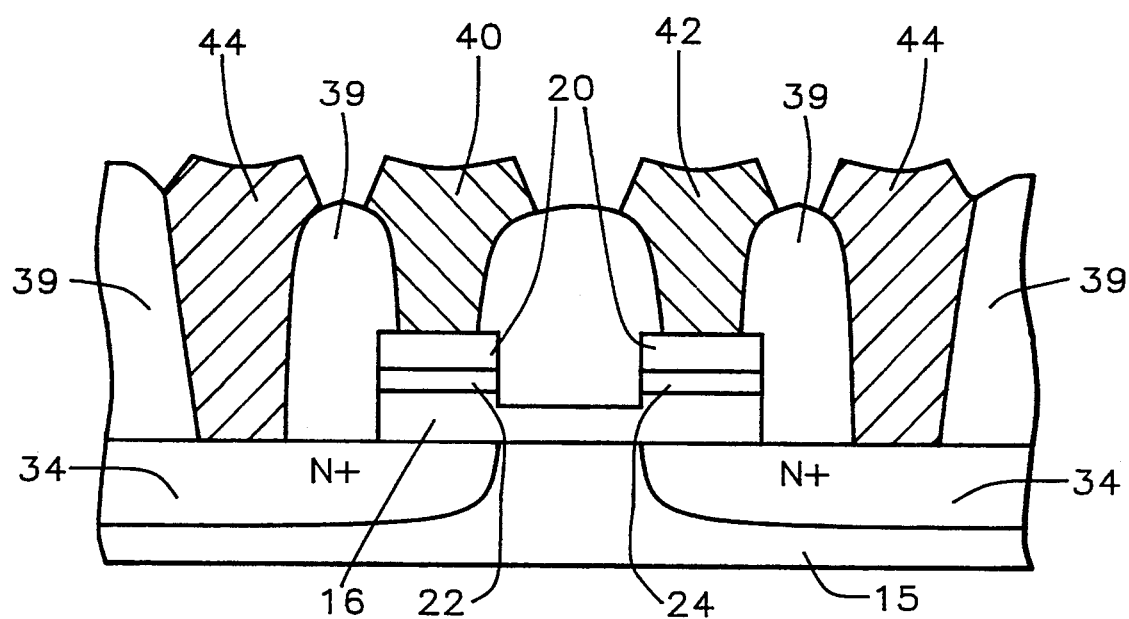

As shown in FIG. 13, a suitable isolation layer 39, typically BPSG is formed over the pedestal and substrate. Then contact openings are made for the emitter, base, and subcollector, and a metal layer sputter deposited. Emitter contact 40, base contact 42, and collector contact 44 are formed and incorporated into a suitable metallurgy circuit (not shown).

A single bipolar structure has been described. However, it is understood that many such transistors can be fabricated simultaneously on a single substrate and interconnected with each other and other associated elements to form a complex integrated circuit device.

While the invention has been particularly shown and described with reference to the preferred embodiments thereof, it will be understood by those skilled in the art that various changes in form and detail may be made therein without departing from the spirit and scope of the invention.

What is claimed is:

1. A method of fabrication a bipolar transistor having a buried subcollector comprising:

forming a collector layer in a monocrystalline semiconductor substrate having a background impurity of a first type by introducing a impurity of a second opposite type into the top surface of the substrate to a depth;

forming a base layer by introducing a first type impurity into the substrate to a depth less than the collector layer;

depositing a polycrystalline silicon layer on the substrate;

forming an emitter region in the base layer by implanting impurity ions of a second type impurity in a concentration greater than the ion concentration in the collector layer to a depth less than the thickness of the base layer;

forming a base contact region in the base layer spaced from the emitter region by implanting impurity ions of a first type in a concentration greater than the ion concentration in the base layer to a depth less than the thickness of the base layer;

forming an oxide layer on the surface of the polycrystalline silicon layer;

depositing a implant-stopping layer over the oxide layer; masking the implant-stopping layer to define spaced areas over the emitter region and the base contact region;

anisotropically etching the unmasked areas of the implant-stopping layer, the oxide layer, and the polycrystalline silicon layer;

partially etching the base layer to a depth slightly exceeding the depth of the emitter and base contact regions, to form pedestals having vertical walls;

masking the emitter and base contact regions and the area between the emitter and base contact regions;

anisotropically etching the exposed remaining base layer, and the collector layer;

depositing a conformal implant-stopping layer over the surface of the substrate;

anisotropically etching the conformal implant-stopping layer to form implant-stopping layers on the vertical walls of the pedestals;

forming a buried subcollector beneath the pedestals by ion implanting impurity ions of a second type at an inclined angle relative to the top surface of the substrate, while rotating the substrate;

removing the implant-stopping layers on the vertical walls of the pedestals and the oxide layer;

removing the oxide layer; forming electrical contacts to the subcollector, the emitter region, and base contact region.

2. The method of claim 1, wherein said first impurity is a P type impurity, and said second impurity is N type impurity.

3. The method of claim 1, wherein said first impurity is a N type impurity, and said second impurity is a P type impurity.

4. The method of claim 1, wherein the collector layer and base layer are formed in the substrate by ion implantation.

5. The method of claim 4, wherein the average impurity concentration in the collector layer is in the range of 1 E 15 to 1 E 17 $cm^{-3}$, and the average impurity concentration in the base layer is in the range of 20 1 E 16 to 1 E 18 $cm^{-3}$.

6. The method of claim 5, wherein the thickness of the collector layer is in the range of 3000 to 10 micrometers, and the thickness of the base layer is in the range of 1000 to 6000 Angstroms.

7. The method of claim 1, wherein said monocrystalline semiconductor substrate is silicon.

8. The method of claim 1, wherein the thickness of said polycrystalline silicon layer is in the range of 500 to 5000 Angstroms.

9. The method of claim 1, wherein the average impurity concentration of said emitter region is in the range of 1 E 18 to 5 E 20 $cm^{-3}$, and the average impurity concentration of said base contact region is in the range of 1 E 18 to 5 E 20 $cm^{-3}$.

10. The method of claim 9, wherein the thickness of the emitter region is in the range of 500 to 5000 Angstroms, and the thickness of the base contact region is in the range of 500 to 5000 Angstroms.

11. The method of claim 1, wherein said implant-stopper is a metal selected from the group consisting of tungsten, molybdenum, tantalum, and mixtures thereof.

12. The method of claim 11, wherein said implant-stopper layer is tungsten.

13. The method of claim 12, wherein the anisotropic etching of the tungsten implant-stopper layer is achieved by reactive ion etching in an atmosphere of $Cl_2$, $CF_xCl_y$, $CHF_xCl_y$, $HBr$, $CF_4$, $C_2F_6$ at a pressure in the range of 5 50 to 1000 mTorr, and a power of between about 100 and 2000 Watts.

14. The method of claim 1, wherein the ion implantation to form the buried subcollector is made at an angle relative to the substrate surface in the range of 3 to 85 degrees.

15. The method of claim 14, wherein the implanted ions to form the subcollector is P, introduced at a concentration of between about 1 E 18 and 1 E 21 $cm^{-3}$, at a energy of between about 50 and 500 KeV.

16. The method of claim 1, wherein the thickness of the conformal implant-stopper layer is in the range of 500 to 10,000 Angstroms.

* * * * *